United States Patent
Wagner

(10) Patent No.: US 10,886,879 B2
(45) Date of Patent: Jan. 5, 2021

(54) DIGITAL MODULATOR AND DIGITAL-TO-ANALOG CONVERSION TECHNIQUES ASSOCIATED THEREWITH

(71) Applicant: Intel Deutschland GmbH, Neubiberg (DE)

(72) Inventor: Elmar Wagner, Taufkirchen (DE)

(73) Assignee: Intel Deutschland GmbH, Neubiberg (DE)

( * ) Notice: Subject to any disclaimer, the term of this patent is extended or adjusted under 35 U.S.C. 154(b) by 272 days.

(21) Appl. No.: 15/350,460

(22) Filed: Nov. 14, 2016

(65) Prior Publication Data

US 2017/0250652 A1 Aug. 31, 2017

Related U.S. Application Data

(63) Continuation of application No. 12/699,560, filed on Feb. 3, 2010.

(51) Int. Cl.
*H03C 3/00* (2006.01)
*H03C 5/00* (2006.01)
*H03C 1/52* (2006.01)

(52) U.S. Cl.
CPC .............. *H03C 5/00* (2013.01); *H03C 1/52* (2013.01)

(58) Field of Classification Search
None
See application file for complete search history.

(56) References Cited

U.S. PATENT DOCUMENTS

| | | | | |
|---|---|---|---|---|
| 3,985,966 A | * | 10/1976 | Edwards | H04M 1/505 370/525 |
| 2003/0085824 A1 | | 5/2003 | Boxho | |
| 2006/0291589 A1 | * | 12/2006 | Eliezer | H03C 3/40 375/302 |
| 2007/0189417 A1 | * | 8/2007 | Waheed | H03C 5/00 375/300 |
| 2007/0211821 A1 | * | 9/2007 | Haque | H03F 3/217 375/297 |
| 2008/0214138 A1 | | 9/2008 | Gomez | |

OTHER PUBLICATIONS

Gentile, Ken, et al., "DDS Simplifies Polar Modulation", www.edn.com, Aug. 5, 2004, p. 69-74.
Non-Final Office Action dated Nov. 9, 2012 for U.S. Appl. No. 12/699,560.
Final Office Action dated Jun. 7, 2013 for U.S. Appl. No. 12/699,560.

* cited by examiner

*Primary Examiner* — Adolf Dsouza
(74) *Attorney, Agent, or Firm* — 2SPL Patent Attorneys PartG mbB

(57) ABSTRACT

The transmitter includes a digital modulator adapted to provide a digital modulated RF signal based on a multi-bit representation of data and a multi-bit representation of a carrier wave. A digital-to-analog converter (DAC) is adapted to generate an analog modulated RF signal based on the digital modulated RF signal. A resonant circuit coupled to an output of the DAC and adapted to filter undesired frequency components from the analog modulated RF signal.

9 Claims, 7 Drawing Sheets

Only Amplitude modulation ($\theta(t)=0$)

224 Instantaneous phase offset (constant)

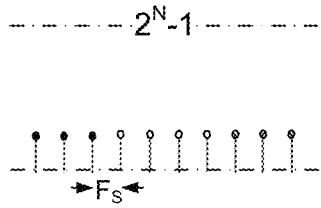

226 Instantaneous phase of carrier wave

210 Angle to amplitude conversion

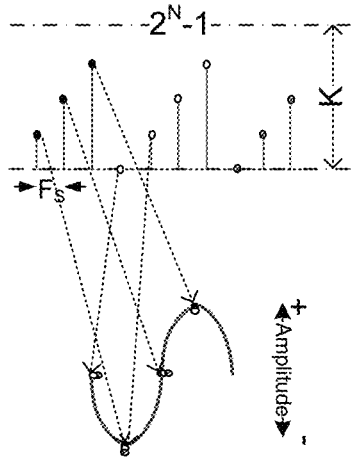

228 Digital data (zero phase modulation)

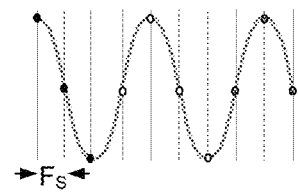

230 Digital Amplitude Modulated data

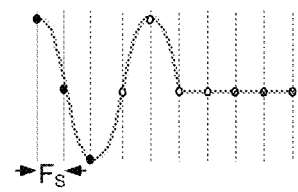

FIG. 2A

Amplitude and Phase modulation

224 Instantaneous phase offset (variable)

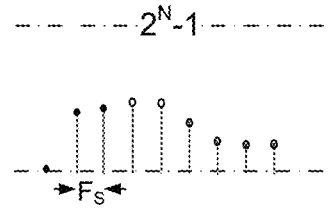

226 Instantaneous phase of modulated carrier wave

210 Angle to amplitude conversion

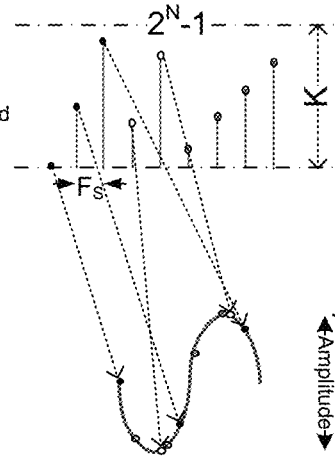

228 Digital Phase Modulated Data

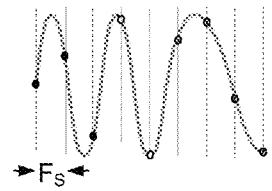

230 Digital Phase and Amplitude Modulated data

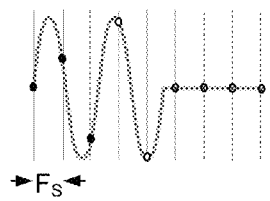

FIG. 2B

DIGITAL MODULATOR AND DIGITAL-TO-ANALOG CONVERSION TECHNIQUES ASSOCIATED THEREWITH

REFERENCE TO RELATED APPLICATION

This Application is a Continuation of U.S. application Ser. No. 12/699,560 filed on Feb. 3, 2010, the contents of which is hereby incorporated by reference in its entirety.

BACKGROUND

Modulation is the process of varying one waveform in relation to another waveform. In telecommunications, modulation is used to convey data from a transmitter to a receiver over a communication channel. For example, transmitters in cellular phones, modems, and other modern communication devices often use modulation to efficiently transmit data.

Although modulation schemes are widely-used in communication systems, previous transmitters have included analog circuitry for implementing the desired analog or digital modulation techniques. However, the inventors have appreciated that analog circuitry is less than ideal because it is inflexible and typically consumes a relatively large amount of power. Consequently, the inventors have appreciated that it is desirable to attempt to modulate waveforms in digital fashion to the greatest extent possible. The use of digital circuitry is advantageous in that it often provides greater flexibility and lower power consumption than analog solutions. The lower power consumption, in particular, enables battery-powered communication devices (e.g., cellular phones) to operate for longer periods of time without re-charging, which is a desirable feature for many end-users.

BRIEF DESCRIPTION OF THE DRAWINGS

FIGS. 2A-2B show waveform diagrams in accordance with the embodiment of FIG. 2.

DETAILED DESCRIPTION

Figure 1:
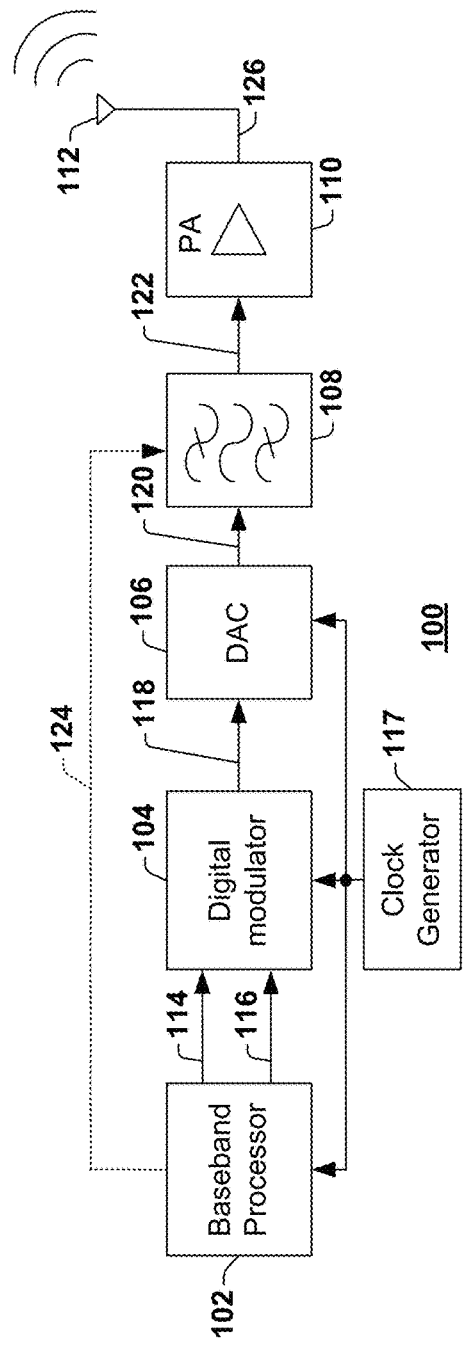
FIG. 1 is a block diagram of a transmitter that includes a digital modulator in accordance with some embodiments.

Transmitter implementations are now described with reference to the drawings, wherein like reference numerals are used to refer to like elements throughout. In the following description, for purposes of explanation, numerous specific details are set forth in order to provide a thorough understanding of the implementations. It may be evident, however, that the implementations may be practiced without these specific details.

Whereas previous transmitters have used analog circuitry to carry out modulation, some aspects of the present disclosure provide digital circuitry to carry out modulation. For example, some embodiments include a digital modulator (e.g., microprocessor or digital application specific integrated circuit (ASIC)), wherein a digital-to-analog converter (DAC) is coupled to an output of the digital modulator. A pass-band filter (e.g., LC resonant circuit) is coupled to an output of the DAC to attenuate unwanted frequency components in the analog waveform provided by the DAC. As will be appreciated in greater detail further herein, the digital circuitry provided herein helps provide flexibility from a programming standpoint while at the same time exhibiting favorable power consumption, thereby helping to provide end-users with a communication device that meets or exceeds their expectations.

FIG. 1 shows one example of a transmitter 100 in accordance with some embodiments. The transmitter 100 includes a baseband processor 102, a digital modulator 104, a digital-to-analog converter (DAC) 106, a passband filter 108, a power amplifier 110, and a radio frequency (RF) antenna 112, which are operably coupled as shown. As will be appreciated in more detail below, the digital modulator 104 generates a stream of multi-bit values (which are collectively representative of a carrier wave onto which data has been modulated), and then the DAC 106 converts the digital data into an analog waveform suitable for transmission over the antenna 112.

The baseband processor 102 includes a first output that provides a frequency control word 114 and a second output that provides a stream of digital data 116, such as I-Q data for example. The frequency control word 114 and digital data 116 are often delivered according to a sampling rate provided by the clock generator 117. The frequency control word 114 can be a multi-bit value that corresponds, for example, to a carrier frequency multiplied by a constant value; and the stream of digital data 116 often specifies how the carrier frequency is to be modulated in time.

Upon receiving the frequency control word 114 and the stream of digital data 116, the digital modulator 104 outputs a digital modulated RF signal 118. The digital modulated RF signal 118 is a time-varying multi-bit value that is based on both the frequency control word 114 and the digital data 116 and which changes according to the sampling rate.

The DAC 106 converts the digital modulated RF signal 118 into an analog modulated waveform 120. Passband filter 108, which can be combined on the same integrated circuit as the DAC 106 and which can include a resonant circuit in some embodiments, removes unwanted frequency components from the analog modulated waveform 120, while allowing a wanted signal 122 to pass through. The power amplifier 110 then amplifies the wanted signal 122, thereby generating a RF signal 126 to be transmitted over the antenna 112.

In some embodiments, the base band processor 102 may also adjust the passband filter 108 (as indicated by optional control signal 124) to allow the wanted signal 122 to pass to the antenna 112. For example, the control signal 124 may adjust a bank of capacitors in the passband filter 108, to "tune" the filter to allow a carrier wave frequency to pass while other undesired frequencies are blocked.

It will be appreciated that because the transmitter 100 includes a digital modulator 104 rather than an analog modulator as used in previous approaches, the transmitter 100 can be programmed to facilitate a variety of communication techniques while keeping power consumption at low-levels. For at least this reason and/or other reasons, various embodiments of transmitters that include a digital modulator are improvements over those previously known.

Figure 2:
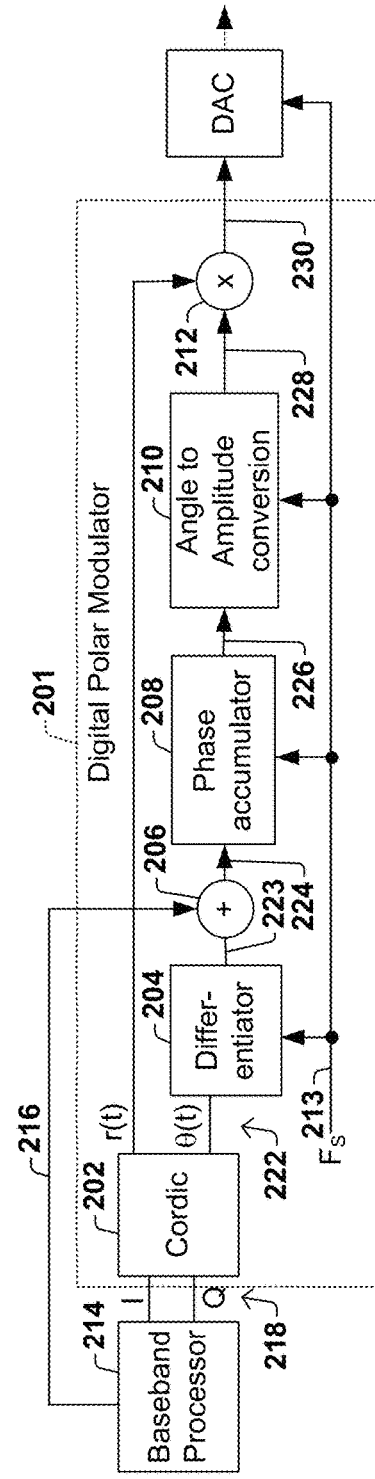
FIG. 2 is a functional block diagram illustrating a transmitter that includes a digital polar modulator.

FIG. 2 shows another embodiment of a transmitter 200 that includes a digital polar modulator 201 (e.g., digital modulator 104 of FIG. 1). The digital polar modulator 201 includes a cordic 202, a differentiator 204, an adder 206, a phase accumulator 208, an angle-to-amplitude conversion element 210, and a digital multiplier 212, which are operably coupled as shown. In many embodiments, each of these components operates on clock signal $F_S$, which is received on clockline 213 (e.g., coupled to clock generator 117 of FIG. 1) and facilitates sampling as described further herein. Although FIG. 2 does not explicitly depict a pass band filter (e.g., resonant circuit), power amplifier, or antenna, it will be appreciated that these components are often included as shown in FIG. 1's implementation, for example.

Referring now to FIG. 2 in conjunction with FIG. 2A, operation of the digital polar modulator 201 is described with regards to amplitude only modulation where no phase modulation is present. Amplitude only modulation begins when a baseband processor 214 provides a frequency control word 216 as well as digital data 218 in I-Q format to the digital polar modulator 201.

The cordic 202 translates the I-Q data 218 into polar data 222, which includes a phase component θ(t) and an amplitude component r(t). Successive polar data values are separated by time $F_S$ (i.e., according to the sampling rate provided on clock line 213), as are successive data values of the frequency control word 216. An advantage of this configuration is that it allows the baseband processor 214 to change the channel frequency (frequency of carrier wave) by changing the frequency control word 216.

The differentiator 204 differentiates the polar data 222, thereby providing a multi-bit instantaneous frequency offset value 223 at the sampling rate. Each instantaneous frequency offset value 223 represents an offset of a present instantaneous frequency or phase relative to a previous successive instantaneous frequency or phase.

At each sampling interval, the adder 206 adds the frequency control word 216 with the instantaneous frequency offset value 223, thereby providing an instantaneous phase offset at 224. As shown in FIG. 2A, for amplitude only modulation the instantaneous phase offset 224 is approximately constant, wherein successive instantaneous phase offset values are separated by sampling interval $F_S$.

The phase accumulator 208 continuously accumulates successive multi-bit instantaneous phase offsets 224, thereby providing an instantaneous phase at the accumulator output 226. The phase accumulator 208 typically includes an N-bit latch such that its output 226 exhibits a range of $0 \leq K \leq 2^N-1$, where K is an N-bit binary number stored in phase accumulator 208 at any time. See numeral 226 in FIG. 2A. Therefore, for some clock cycles, when an instantaneous phase offset value 224 is added to the N-bit binary number (K) presently stored in the phase accumulator 208, the resultant N-bit binary number K exceeds $2^N-1$, thereby causing the phase accumulator 208 to overflow. Because the accumulator is modular in this respect, the accumulator output 226 can be interpreted as an N-bit instantaneous phase or "angle" of a carrier wave.

The angle-to-amplitude conversion element 210, which include a memory that stores a sine or co-sine lookup table in some embodiments, receives this N-bit instantaneous phase 226, and outputs a corresponding multi-bit binary number 228. As shown in FIG. 2A (210), the angle to conversion element "maps" the instantaneous phase at accumulator output 226 to an amplitude value of a digital waveform, such as a sine or co-sine waveform.

The digital multiplier 212 receives the stream of multi-bit numbers 228, and selectively modifies this stream based on the amplitude component r(t) to produce a stream of multi-bit numbers representing an amplitude-modulated waveform 230. Thus, in the illustrated example of FIG. 2A, a latter portion of the waveform 228 has been amplitude-modulated to have an amplitude of zero in 230. In this way, the digital polar modulator 201 outputs a stream of multi-bit binary numbers that vary according to sample rate $F_S$, and which is representative of a polar modulated waveform.

FIG. 2B shows another example wherein the digital polar modulator 201 is used to achieve an amplitude and phase modulated waveform at the output 230 of the digital polar modulator 201. The digital polar modulator could also achieve other types of modulation in addition to those that are illustrated.

Figure 3:
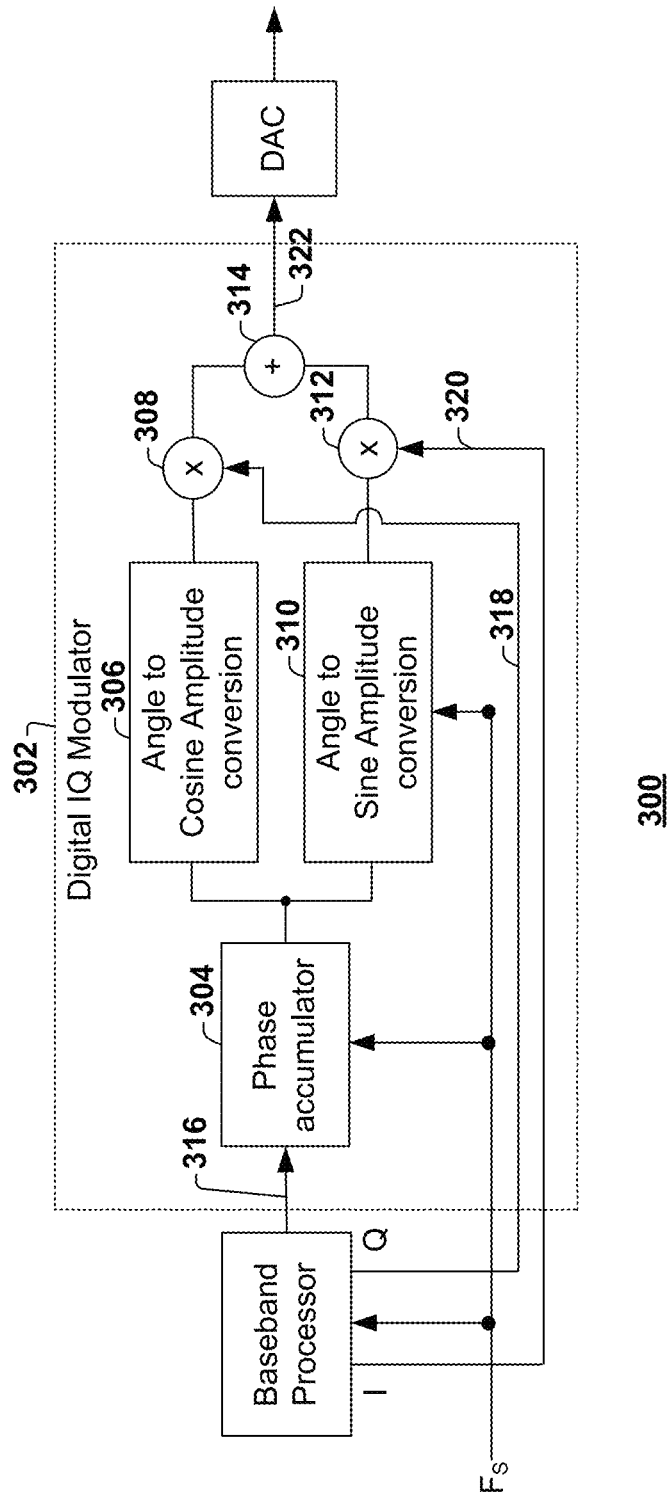
FIG. 3 is a functional block diagram illustrating a transmitter that includes an IQ modulator.

FIG. 3 shows another embodiment of a transmitter 300 that includes a digital IQ modulator 302 (e.g., digital modulator 104 of FIG. 1). The digital IQ modulator 302 includes a phase accumulator 304, an angle to cosine amplitude conversion element 306 coupled to a first mixer 308, an angle to sine amplitude conversion element 310 coupled to a second mixer 312, and an adder 314, all of which are operably coupled as shown. Although FIG. 3 does not explicitly depict a pass band filter (e.g., resonant circuit), power amplifier, or antenna, it will be appreciated that these components are often included as shown in FIG. 1's implementation, for example.

During operation, a frequency control word 316 is provided to the phase accumulator 304, which again accumulates successive frequency control words according to the sampling rate F. The accumulated value is then output to the cosine and sine amplitude conversion elements 306, 310 (e.g., cosine and sine lookup tables, respectively). Thus, a multi-bit value indicative of a cosine amplitude is provided to the first mixer 308, where it is mixed with the Q-data signal 318. Another multi-bit value indicative of a sine amplitude is provided to the second mixer 312, where it is mixed with the I-data signal 320. The mixed signals are then summed at the adder 314 to generate a stream of multi-bit numbers on 322 representing a digital I-Q modulated waveform to be transmitted over an antenna.

Figure 4:
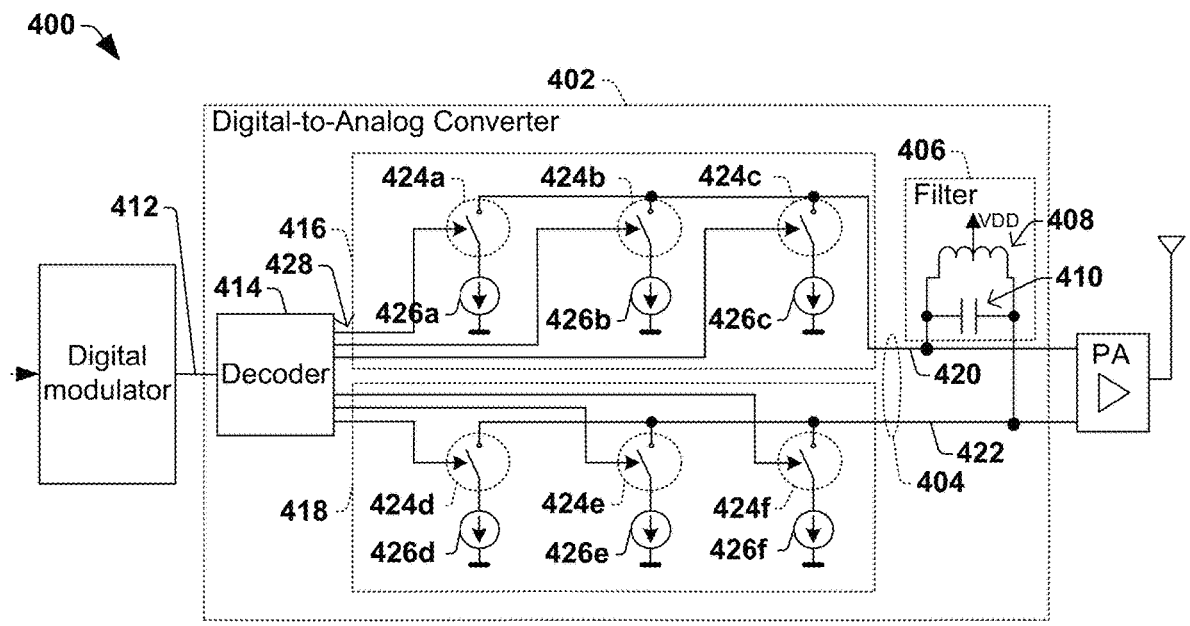
FIG. 4 is a block diagram of a transmitter that includes a more detailed embodiment of a digital-to-analog converter.

FIG. 4 illustrates another transmitter 400 (e.g., transmitter 100, transmitter 200, or transmitter 300) that includes a DAC 402 having a differential output 404 coupled to a pass band filter 406. In the illustrated embodiment, the pass band filter 406 comprises a resonant circuit, such as an L-C circuit made up of an inductor 408 and a capacitor 410. In other embodiments, the pass band-filter 406 could comprise a surface acoustic wave (SAW) filter, bulk acoustic wave (BAW) filter, duplexer, or some other type of resonant circuit. In any case, the filter is adapted to remove unwanted frequency components from an analog waveform provided at the output 404 of DAC.

Upon receiving a stream of multi-bit values representing a modulated waveform at input 412, the DAC 402 converts the stream of multi-bit values into an analog waveform suitable for transmission at output 404. To facilitate this behavior, the DAC may include a decoder 414 and first and second variable current sources (416, 418, respectively).

The first variable current source 416 is coupled to a first leg 420 of the differential output 404, and the second variable current source 418 is coupled to a second leg 422 of the differential output 404. Each variable current source is made up of a plurality of individually selectable current sources. The individually selectable current sources comprise respective switching elements 424a-424f (e.g., MOS transitors) in series with respective current sources 426a-426f (e.g., MOS transistors). Each switching element can include a gate operably coupled to a different bit line of a bus 428. For purposes of illustration, FIG. 4 shows each variable current source consisting of three individually selectable current sources; however, it will be appreciated that other embodiments may include any number of individually selectable current sources. In addition, the current sources 426a-426f can be constant current sources or variable current sources, depending on the implementation. For example, rather then using a switch 424a in series with current source 426a, other embodiments can replace these two elements with a single variable or switchable current source.

Figure 5:
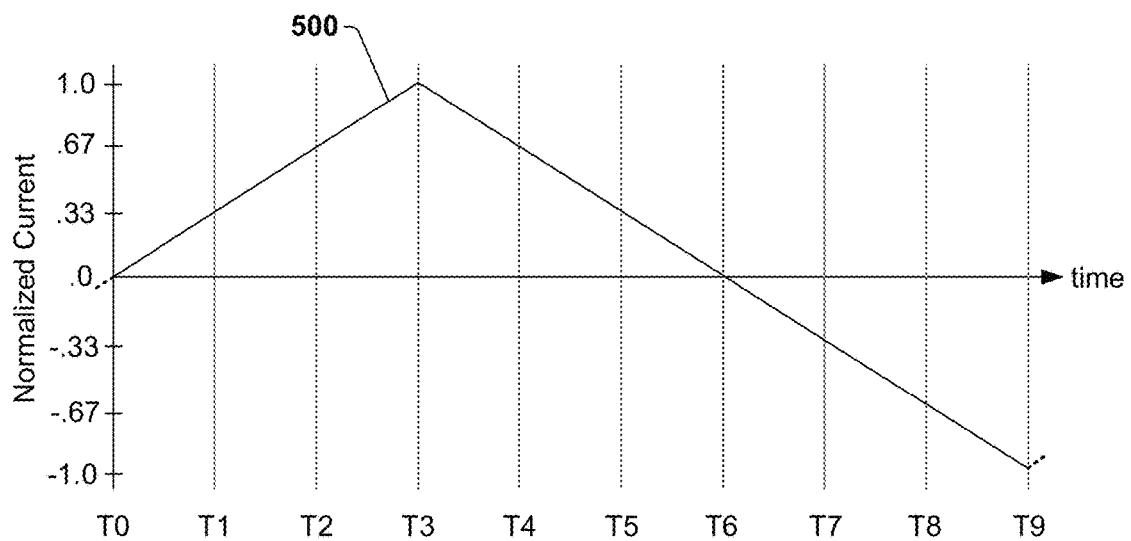
FIG. 5 illustrates a sawtooth waveform which can be generated by the digital-to-analog converter of FIG. 4.

To highlight one example of how FIG. 4's transmitter 400 could produce at its differential output 404 a saw-tooth waveform 500 as shown in FIG. 5, reference is made to Table 1 below. It will be appreciated that, in practical implementations it would be difficult to generate sawtooth waveform 500 with the DAC 402. This is because the presence of filter 406, which is of a passband variety, would typically block many of the frequency components necessary for such a sawtooth wave. Nonetheless, FIG. 5's sawtooth example is discussed below to illustrate how the current sources 426a-426f and transistors 424a-424f collectively operate to achieve time varying analog waveforms at the differential output 404.

With that said, in Table 1's example, a three-bit binary signal is provided at the output 412 of digital modulator, and the decoder 414 converts the three bit binary signal to a six-bit binary signal on bus 428. These multi-bit binary signals change in time (T0-T9) to selectively couple individual current sources 426a-426f to the differential output 404 to generate the sawtooth analog waveform 500.

TABLE 1

| Time | Modulated waveform value on 412 | Decoder output word on 428 | Condition of Switching elements 424a-424f | Analog Output Value on 404 |
|---|---|---|---|---|
| T0 | 000 | 111_111 | ON: none<br>OFF: 424a-424f | 0 |
| T1 | 001 | 011_111 | ON: 424a<br>OFF: 424b-424f | 0.33 |
| T2 | 010 | 001_111 | ON: 424a, 424b<br>OFF: 424c-424f | 0.67 |
| T3 | 011 | 000_111 | ON: 424a-424c<br>OFF: 424d-424f | 1.0 |
| T4 | 010 | 001_111 | ON: 424a, 424b<br>OFF: 424c-424f | 0.67 |
| T5 | 001 | 011_111 | ON: 424a<br>OFF: 424b-424f | 0.33 |
| T6 | 000 | 111_111 | ON: none<br>OFF: 424a-424f | 0 |
| T7 | 101 | 111_011 | ON: 424f<br>OFF: 424a-424e | −0.33 |
| T8 | 110 | 111_001 | ON: 424e-424f<br>OFF: 424a-424d | −0.67 |
| T9 | 111 | 111_000 | ON: 424d-424f<br>OFF: 424a-424c | −1 |

For purposes of simplicity the example in Table 1 assumes that the individual current sources 426a-426f are substantially identical. In other embodiments, however, the current sources 426a-426f comprise transistors with different length to width ratios that supply different currents. In addition, although Table 1 and FIG. 5 show a saw-tooth wave for purposes of illustration, it is to be appreciated that the analog waveform that is output will often be a modulated waveform (e.g., frequency modulated, amplitude modulated, or phase modulated). Note that all digital modulation schemes (e.g., phase shift keying (PSK), quadrature amplitude modulation (QAM), orthogonal frequency division multiplexing (OFDM)) can make use of phase and amplitude modulation, and the disclosed techniques are not limited to analog frequency or amplitude modulation.

Figure 6:
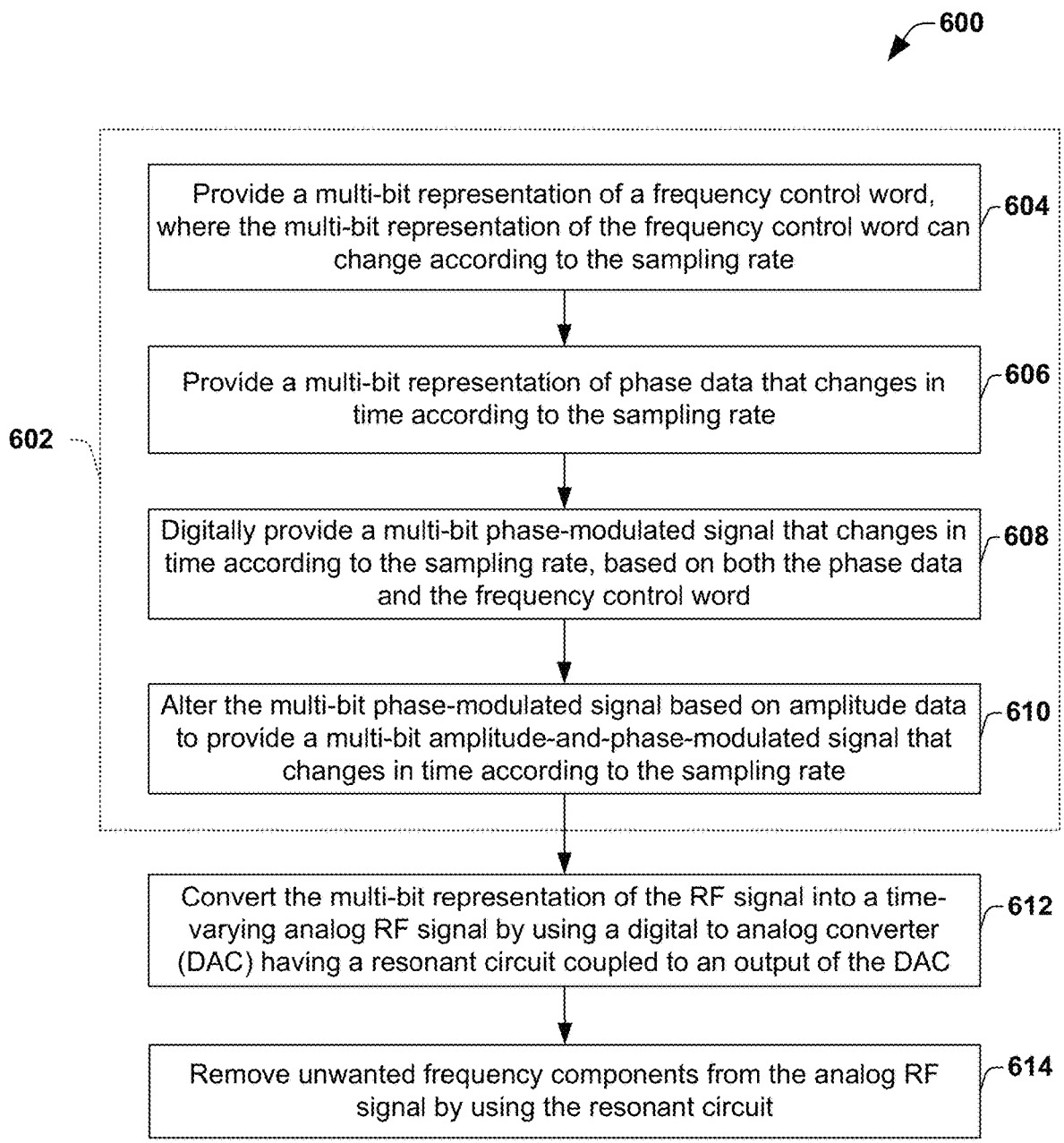
FIG. 6 is a flow diagram illustrating a method in accordance with some embodiments.

FIG. 6 shows a methodology in accordance with some aspects of this disclosure. While this method is illustrated and described below as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

FIG. 6 starts at 602 when a multi-bit representation of an RF signal is generated. The multi-bit representation of the RF signal often changes in time according to a sampling rate. Generation of the multi-bit RF signal may include several sub-blocks. For example FIG. 6 shows an example that includes four sub-blocks (604, 606, 608, and 610) that collectively achieve amplitude and phase modulation of data onto a carrier wave. Other embodiments could include other sub-blocks depending on the type of modulation employed.

At 604, the method 600 provides a multi-bit frequency control word. The multi-bit frequency control word can change according to a sampling rate, although it is often constant for a considerable amount of time during which the transmitter transmits over a given frequency channel. For example, FIG. 2's previously discussed embodiment of a transmitter 200 disclosed a frequency control word 216 which changed in time according to sampling rate $F_S$.

At 606, the method 600 provides a multi-bit representation of phase data that changes in time according to the sampling rate. For example, FIG. 2's previously discussed embodiment of transmitter 200 disclosed polar data 222 that included phase data (θ(t)) that changed in time according to sampling rate $F_S$.

At 608, the method 600 digitally provide a multi-bit phase-modulated signal based on the phase data and the frequency control word, wherein the multi-bit phase modulated signal changes in time according to the sampling rate. For example, FIG. 2's previously discussed embodiment of transmitter 200 disclosed phase modulated data 228 that changed in time according to sampling rate $F_S$.

At 610, the method 600 alters the phase-modulated data based on amplitude data to provide a multi-bit amplitude-and-phase modulated signal that changes in time according to the sample rate. For example, FIG. 2's previously discussed embodiment of transmitter 200 disclosed amplitude-and-phase modulated data 230 that changed in time according to sampling rate $F_S$.

At 612, the method 600 converts the multi-bit representation of the RF signal into a time-varying analog RF signal. This conversion is carried out by a digital-to-analog converter (DAC) having a resonant circuit (e.g., LC circuit) coupled to its output.

At 614, the method uses the resonant circuit to remove unwanted frequency components from the analog RF signal. Because this method 600 modulates waveforms in digital fashion, this method tends to provide greater flexibility and lower power consumption than corresponding analog solutions.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Figure 7:
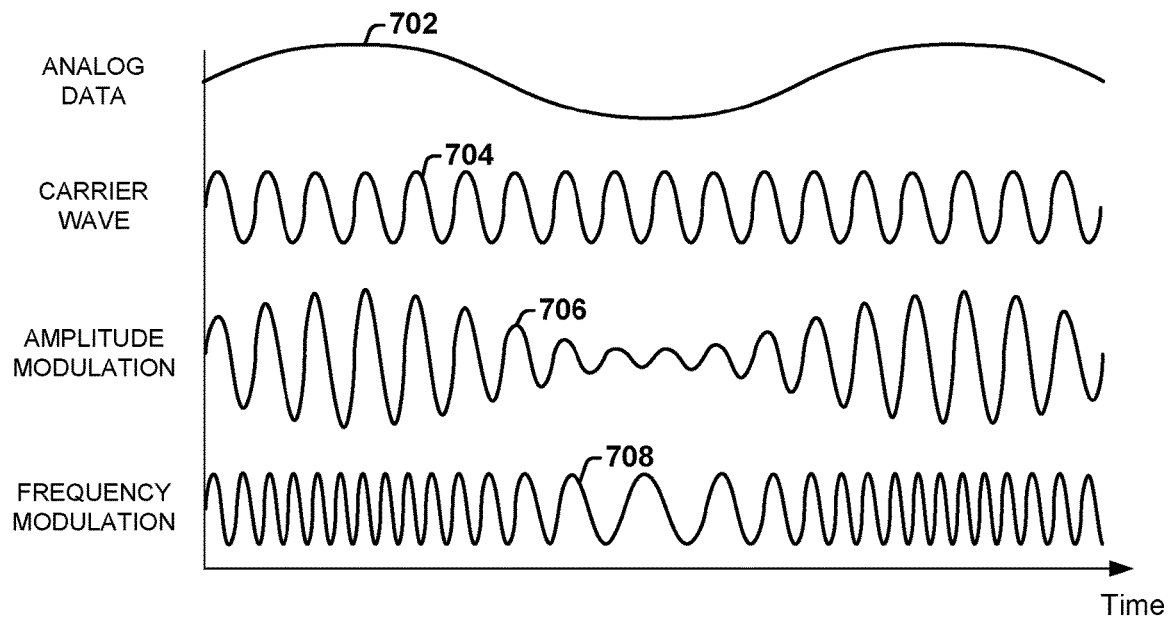
FIG. 7 is a series of waveforms that show some modulation techniques in which analog data is modulated onto a carrier wave.
Figure 8:
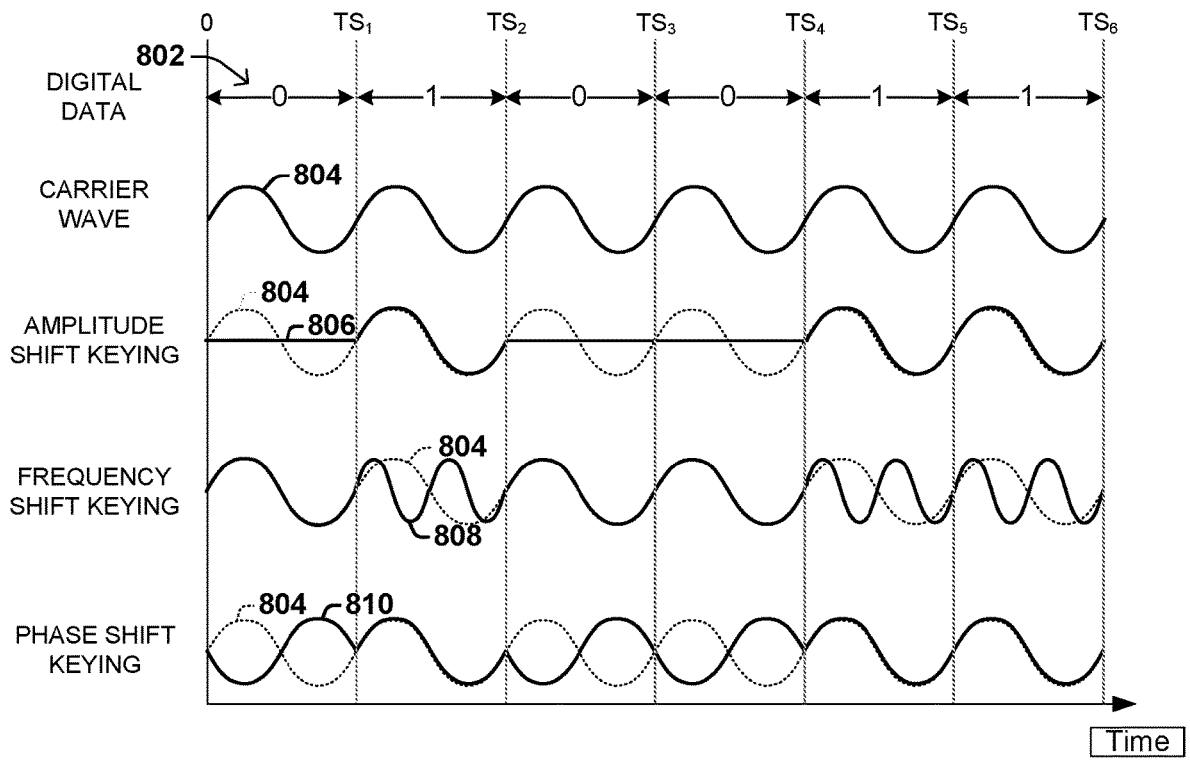
FIG. 8 is a series of waveforms that show some modulation techniques in which digital data is modulated onto a carrier wave.

To provide a few examples of basic modulation techniques that may be employed by transmitters in accordance with some embodiments, this disclosure now turns to FIGS. 7-8. More particularly, FIG. 7 shows analog data (e.g., analog voice data) being modulated onto a carrier wave according two different types of modulation (amplitude and frequency modulation); while FIG. 8 shows digital data (i.e., digital message "010011 . . . ") being modulated onto a carrier wave according to three different types of modulation (amplitude, frequency, and phase shift keying). FIGS. 7-8 and the description below are intended to provide a context for some ways in which modulation can be used to transmit data over a communication channel. However, it will be appreciated that these figures are not intended to in any way encompass all types of modulations which may be used, and are not to be construed in a limiting manner.

FIG. 7 shows analog data 702 being modulated onto a carrier wave 704 according to two different types of modulation (amplitude modulation and frequency modulation). In amplitude modulation, an amplitude modulated wave 706 has a time-varying amplitude indicative of the analog data 702. In frequency modulation (which can be also be thought of as phase modulation in some contexts), the frequency modulated wave 708 has a time-varying frequency indicative of the analog data 702. Modulation with analog data can also include combinations of amplitude, frequency and phase modulation.

In digital transmission (FIG. 8), one or more bits of digital data 802 are transmitted according to a regularly repeating symbol period. It will be appreciated that although each symbol in the illustrated examples of FIG. 8 conveys only a single bit of data, in other implementations a symbol can convey multiple bits of data. In addition, many implementations (e.g., QAM, EDGE) may use combinations of these modulation techniques. For example, some implementations may use both amplitude and frequency modulation, while other implementations may use both amplitude and phase modulation.

In amplitude shift keying (ASK) modulation, for example, a transmitter can modulate the digital data 802 onto a carrier wave 804 such that an ASK-modulated waveform 806 exhibits a time-varying amplitude indicative of the digital data 802. Thus, during the first symbol period of 0 to $TS_1$, the ASK-modulated waveform 806 has an amplitude of approximately zero (e.g., representing a "0" data state). During the second symbol period of $TS_1$ to $TS_2$, the ASK-modulated waveform 806 has an amplitude of approximately one relative to that of the carrier wave (e.g., representing a "1" data state). Other symbol periods $TS_3$, $TS_4$, $TS_5$, and $TS_6$ show similar encoding.

In frequency shift keying (FSK) modulation, the transmitter can modulate the digital data 802 onto the carrier wave 804 such that a FSK-modulated waveform 808 exhibits a time-varying frequency indicative of the digital data 802. Thus, during the first symbol period 0 to $TS_1$, the FSK-modulated waveform 808 has a first frequency $f_1$ (e.g., representing a "0" data state). During the second symbol period $TS_1$ to $TS_2$, the frequency modulated waveform 808 has a second frequency $f_2$ (e.g., representing a "1" data state), and so on.

In phase shift keying (PSK) modulation, a transmitter can modulate the digital data 802 onto the carrier wave 804 such that a PSK-modulated waveform 810 exhibits a time-varying phase indicative of the digital data 802. Thus, during the first symbol period 0 to $TS_1$, the PSK-modulated waveform 810 is completely in-phase with the carrier wave 804 and thus has a zero degree phase offset relative to the carrier wave (e.g., representing a "0" data state). During the second symbol period $TS_1$ to $TS_2$, the PSK-modulated waveform 810 is 180° out of phase with the carrier (e.g., representing a "1" data state).

Whatever type of modulation is used by a transmitter, the corresponding receiver can "decode" the modulated waveform by comparing the received waveform to the expected carrier wave, which is generally specified prior to communication. In this way, analog or digital data can be modulated onto a carrier wave to convey a message from transmitter to receiver.

It will be appreciated that digital modulators in accordance with this disclosure can take many forms in addition to those disclosed above. For example, FIGS. 9-10 show some transmitter embodiments where a digital up-conversion or up-sampling element is included between an angle to conversion element and a DAC.

Figure 9:
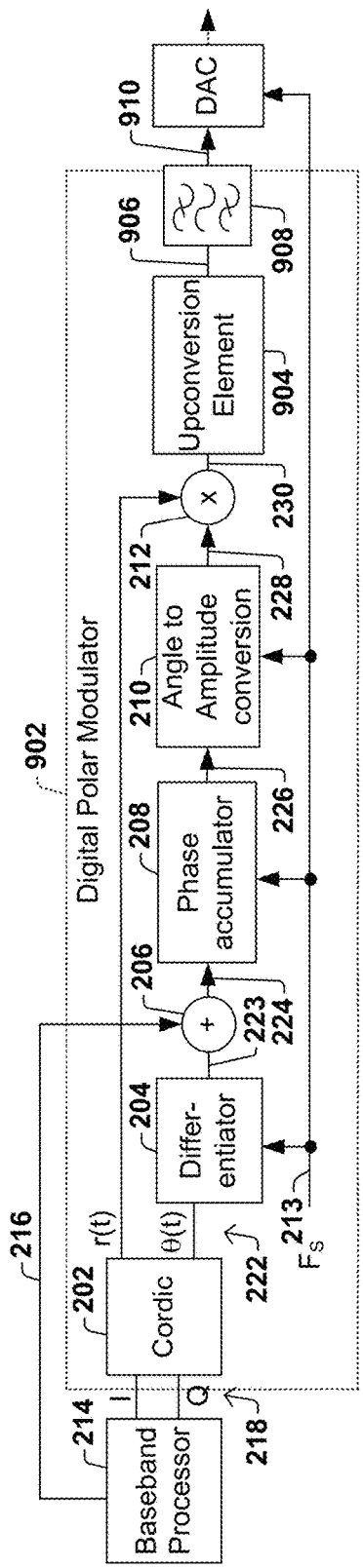
FIGS. 9-10 illustrate examples of transmitters that include a digital up-conversion element in accordance with some embodiments.

More particularly, FIG. 9 shows an embodiment of a transmitter 900 that includes digital polar modulator 902 with components similar to that of FIG. 2, except that FIG. 9's digital polar modular 902 includes an up-conversion element 904. In FIG. 9's embodiment, a digital modulated waveform is provided at output 230 with a first frequency. The up-conversion element 904 increases the frequency of this digital modulated waveform such that an up-converted modulated waveform at output 906 includes a second frequency that is higher than the first frequency. In one embodiment, for example, the digital modulated waveform at output 230 has a frequency of about 100 MHz and the up-converted modulated waveform at output 906 includes a frequency of about 900 MHz, although a wide range of other frequencies are also possible.

The up-conversion element 904 can accomplish this frequency upshift in various manners. For example, the up-conversion element 904 can insert additional sample values between successive multi-bit values from output 230. This results in alias signals on output 906, some of which are wanted signals and some of which are unwanted signals. By using a digital filter 908, the wanted signals (which represent a waveform with a higher frequency than that of the multi-bit values on output 230) can be selected, and the unwanted signals can be blocked. Thus, only the wanted signals are passed through to the output 910 and to the DAC. For example, the output 230 could have a sampling rate of 250 million samples per second (MSPS) and represent a modulated wave at 100 MHz. By using four times oversampling, the up-conversion element 904 achieves a sampling rate of 1000 MSPS and an aliasing signal at 900 MHz (as well as other unwanted frequencies). The digital filter 908 then passes the wanted 900 MHz signal to the DAC, while blocking the other unwanted frequencies.

Figure 10:
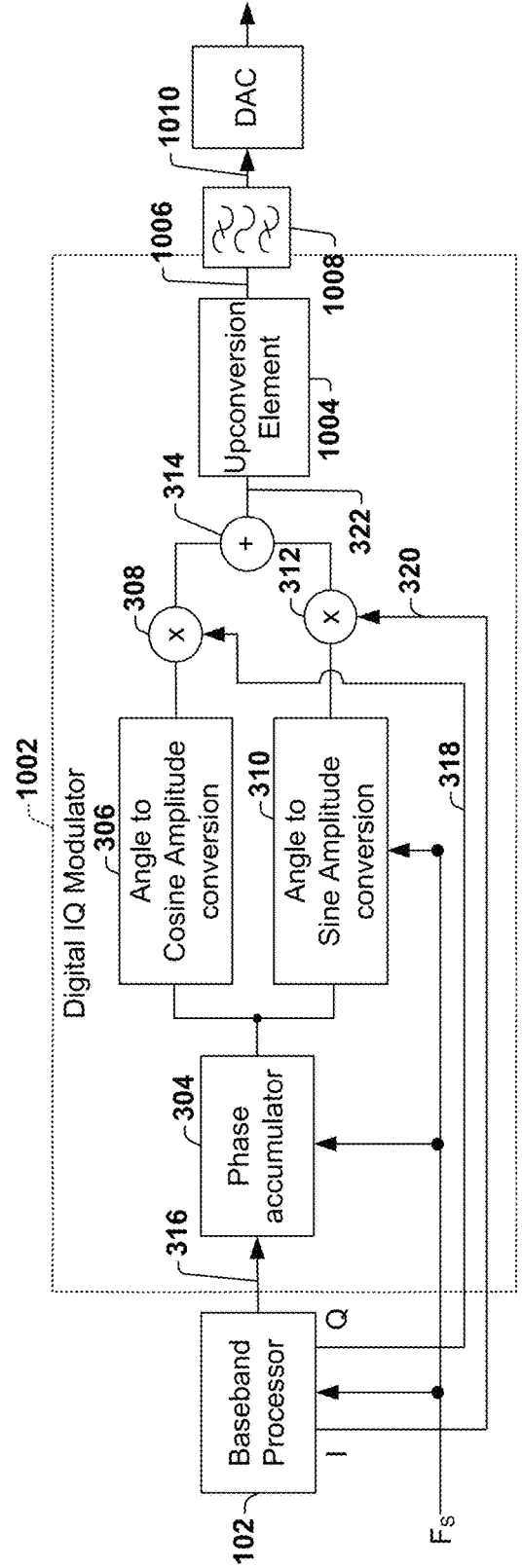

FIG. 10 shows an embodiment of a transmitter 1000 that includes a digital IQ modulator 1002 with components similar to that of FIG. 3, except that FIG. 10's digital IQ modular 1002 includes up-conversion element 1004. In FIG. 10's embodiment, an IQ digital modulated waveform is provided at output 322 with a first frequency. The up-conversion element 1004 increases the frequency of the IQ digital modulated waveform on 302 such that up-converted modulated waveform at output 1006 exhibits a second frequency that is higher than the first frequency. Because this up-conversion can cause aliasing, a digital filter 1008 can also allow a wanted signal 1010 to pass to the DAC while blocking unwanted signals.

Certain terms are used throughout the specification to refer to particular system components. As one skilled in the art will appreciate, different companies can refer to a component by different names. This document does not intend to distinguish between components that differ in name but not function herein. In this document the terms "including" and "comprising" are used in an open ended fashion, and thus should be interpreted to mean "including, but not limited to . . . ." Also, the term "couple" (and variations thereof) is intended to mean either an indirect or direct electrical connection. Thus, if a first element is coupled to a second element, that connection may be a direct electrical connection, or may be an indirect electrical connection via other elements and connections. Although various approximately numeric values are provided herein, these numeric values are merely examples should not be used to limit the scope of the disclosure.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A circuit that includes a digital modulator, the digital modulator comprising:

a differentiator to receive successive phase values at a sampling rate and provide differentiated phase values based on the phase values;

an adder to provide successive instantaneous phase offset values at the sampling rate based on both the differentiated phase values and a frequency control word;

a phase accumulator to provide successive instantaneous phase values at the sampling rate based on the instantaneous phase offset values; and an angle-to-amplitude converter to convert the instantaneous phase values to a multi-bit representation of a phase modulated wave at the sampling rate.

2. The circuit of claim 1, where the digital modulator further comprises:

a multiplier to receive successive amplitude values and the multi-bit representation of the phase modulated wave at the sampling rate; and the multiplier to output a multi-bit amplitude-and-phase-modulated signal that changes in time according to the sampling rate.

3. The circuit of claim 2, further comprising:

a baseband processor to provide both the successive phase values and a frequency control word to the digital modulator, where the frequency control word is associated with a frequency channel over which the phase modulated wave is to be transmitted.

4. The circuit of claim 3, where the baseband processor provides the phase values in I-Q format, the circuit further comprising:

a cordic to convert the phase values in I-Q format to phase values in polar format.

5. The circuit of claim 1, further comprising:

a digital-to-analog converter (DAC) to generate an analog modulated RF signal based on the multi-bit representation of the phase modulated wave.

6. The circuit of claim 5, further comprising:

a digital up-conversion element operably coupled between the DAC and the angle-to-amplitude converter, where the digital up-conversion element increases a frequency of the phase modulated wave from a first frequency to a second frequency; and a digital filter operably coupled between the digital up-conversion element and the DAC, and configured to block values associated with unwanted frequencies at the output of the digital up-conversion element.

7. The circuit of claim 5, further comprising:

a resonant circuit coupled to an output of the DAC and adapted to filter undesired frequency components from the analog modulated RF signal.

8. The circuit of claim 1, wherein the angle-to-amplitude converter comprises a look up table (LUT) that comprises a memory configured to map the instantaneous phase values to respective amplitude values that correspond to the multi-bit representation of the phase modulated wave.

9. The circuit of claim 8, wherein the LUT comprises a sine or cosine LUT configured to perform the mapping.

* * * * *